United States Patent [19]

Moates

[11] Patent Number: 4,536,762

[45] Date of Patent: Aug. 20, 1985

[54] MATRIX ENCODER FOR SENSOR ARRAYS

[75] Inventor: Roger D. Moates, Raleigh, N.C.

[73] Assignee: Westinghouse Electric Corp., Pittsburgh, Pa.

[21] Appl. No.: 378,536

[22] Filed: May 17, 1982

[51] Int. Cl.³ .................. G08C 19/00; G08C 19/36; G08C 19/04

[52] U.S. Cl. .................. 340/870.02; 340/870.38; 340/870.29; 340/347 P; 250/231 SE

[58] Field of Search ........... 340/870.02, 870.29, 340/870.38, 347 P, 365 S; 250/231 SE

[56] References Cited

U.S. PATENT DOCUMENTS

| | | | |
|---|---|---|---|
| 3,573,773 | 4/1971 | O'Hanlon | 250/227 |
| 3,806,875 | 4/1974 | Georget | 340/310 R |
| 4,037,219 | 7/1977 | Lewis | 340/347 P |
| 4,137,451 | 1/1979 | Einolf | 250/231 SE |
| 4,145,687 | 3/1979 | Masuda | 340/365 S |
| 4,207,616 | 6/1980 | Heeren | 365/189 |
| 4,269,102 | 5/1981 | Kondo | 340/365 S |

*Primary Examiner*—James J. Groody
*Attorney, Agent, or Firm*—William D. Lanyi

[57] ABSTRACT

A meter dial register encoder employs a plurality of photoresistor sensors in a row and column matrix configuration. A microcomputer selectively scans the photoresistors to determine whether they are illuminated or non-illuminated. Each column of the row and column matrix contains a scanned photoresistor and a plurality of unscanned photoresistors operated in a two-or-three-out-of-five code, with one terminal of the scanned photoresistor being selectively connected to a 5 volt source by a microcomputer, the other terminal of the photoresistor being connected to the column conductor. The unscanned photoresistors of the column are connected between the column conductor and a separate terminal of the microcomputer held at ground potential. The column conductor is supplied to one terminal of a two terminal comparator, the other terminal of which is connected to a source of reference voltage. The photoresistors of each column thus comprise a voltage divider circuit, the output of which is monitored by the comparator. The unscanned photoresistors of each column serve as a reference for the scanned photoresistor, allowing the use of photoresistors having much greater variation in illuminated on resistance state while providing an accurate determination of whether the scanned photoresistor is illuminated or non-illuminated.

8 Claims, 5 Drawing Figures

MATRIX ENCODER FOR SENSOR ARRAYS

BACKGROUND OF THE INVENTION

1. Field of the Invention

The invention relates to encoders and more particularly to encoders including matrix arrays of electrical sensors.

2. Description of the Prior Art

Encoders are widely used in electrical apparatus to provide a signal indicative of a monitored condition. Generally, an encoder includes a transducer or sensor unit, a detecting unit, and a readout unit. The transducer unit typically includes an array of electrical sensors having variable voltage, current, impedance, frequency, or other electrical parameter which changes in response to a monitored condition. The detecting unit includes both sampling control and detecting circuits to sample the electrical state of the sensors and produce output signals corresponding to the sensor states. These output signals are, in turn, converted by the readout unit into coded output signals representing the status information from the sensors in a desired format. One example of an encoder application is a keyboard for a computer or electric typewriter, which provides an electrical signal indicative of which of the keyboard keys have been activated.

Another application utilizing encoder apparatus is a meter dial encoding register device for use with a watthour meter of the type typically employed to measure the amount of electrical energy consumed by an electric utility customer. The meter has a mechanical register including a plurality of dials which provide a visual indication of the amount of electrical energy consumed. An encoder is provided to translate the position of the dial shafts into an electrical signal such that the same information regarding the consumption of electrical energy as is shown by the dials is transmitted by an electrical signal to electronic apparatus located either at the meter site or at a remote location.

The encoder often consists of an array of photoresistive sensors to detect the presence or absence of illumination, as controlled by notched discs which rotate upon the shafts of the meter register to alternately permit and prevent the transmission of light from an illumination source to the photoresistors, in response to rotation of the register shafts. It is well known to connect the sensor array as a matrix to enable faster, more efficient sampling of the sensors. Examples of arrays having photoresistive sensors are described in U.S. Pat. Nos. 4,037,219, 4,137,451, 3,806,875, 3,662,368, and 3,573,773.

An improved meter dial encoder utilizing a photoresistive sensor matrix array is described in U.S. Pat. No. 4,374,384, which issued to Moates on Feb. 15, 1983. In the encoder disclosed therein, the sensors are arranged in a row and column matrix and include apparatus to maintain a minimal voltage difference between the matrix columns. This prevents undesirable cross-coupling between the columns to eliminate the need for separate isolation elements as was sometimes required in other matrix array encoders. The encoder disclosed in the aforementioned U.S. Pat. No. 4,374,384 is responsive to the current flow through the individual photoresistors, which varies in response to changes in illumination which is incident thereon.

The photoresistors vary their resistance according to the degree of illumination which is incident thereon. However, the material utilized in the photoresistors also varies in its reaction to specified amounts of light. For example, cadmium sulfide, the photoresistive material used in the sensor array of the aforementioned U.S. Patent, has a room temperature dark resistance which can vary from 10 megohms to greater than 1,000 megohms. The resistance of each cadmium sulfide photoresistor when fully illuminated is a much lower value at room temperature, ranging from approximately 10 kilohms to 1 megohm. An additional factor which causes differing resistance of illuminated photoresistors is the differing amount of light which is actually incident upon the photoresistor when the notched code wheel is not blocking the source of illumination. This can result from unequal losses in the various light paths from illumination source to photoresistor and from variations in the strength of the illumination source itself.

A crucial function of the encoder is to definitively determine whether a photoresistor is in an illuminated or non-illuminated state from the resistance of the photoresistor. This is accomplished by establishing a threshold value such that when the resistance of a photoresistor is below the threshold value it is considered to be illuminated and when its resistance is above the threshold value it is considered to be dark.

One method of establishing the threshold is to employ a reference photoresistor which is known to be illuminated. In the encoder disclosed in the aforementioned U.S. patent application, this reference photoresistor was deposited on the same photoresistor array as the photoresistors connected in the matrix, but was not itself matrix connected. Since the reference cell and the matrix cells were formed from a common chemical batch and deposited in a common operation, the photoresistance characteristics of the cells could be assumed to be quite similar. However, some variation in properties does occur even between individual photoresistors on a commonly deposited array, and, as variously mentioned, varying light paths may cause differing amounts of incident radiation between photoresistors, both of which are in an illuminated condition.

In order for the photoresistors to provide a reliable indication of the angular positions of the code wheels, it was therefore necessary to exercise considerable care in the construction of the arrays and in the selection of arrays to actually be used, to thus insure very tight tolerances on the array electrical parameters. Similar care was necessary to insure a uniform attenuation of various light paths. Such measures naturally increase the cost of manufacture.

In some prior art encoder circuits, the selection circuitry would scan a subset of the matrix sensors, either singly or in groups, to determine whether or not the sensors were in the presence or absence of the sensed condition. The non-selected sensors were held in a known high impedance state. This tended to produce susceptibility to noise impulses.

It is therefore an objective of the present invention to provide an encoder for a sensor array which can accurately determine the presence or absence of a sensed quantity using sensors having a larger variation in response to a common sensed condition.

It is a further objective of the present invention to provide an encoder which exhibits higher immunity to noise impulses.

SUMMARY OF THE INVENTION

In accordance with the principles of the present invention an encoder is provided for a sensor array which includes a plurality of sensors operable between a first electrical state in the absence of a sensed condition and a second electrical state in the presence of a sensed condition. Means are further provided to select a subset of sensors. Comparator means are provided which are connected to both the selected subset and to the non-selected sensors. An electrical reference source is also connected to the comparator means. The electrical characteristics of both the selected and non-selected sensors are then utilized by the comparator means to determine if the selected sensors are in the first or the second electrical state. The comparator means then generates an output signal representative of the electrical state of the selected sensors.

In a preferred embodiment of the invention, the sensors comprise a plurality of photoresistive sensors operable between a high resistance state in the absence of illumination and a low resistance state in the presence of illumination. Each of the resistive states are defined by a range of values having an upper and a lower limit. The photoresistive sensors are connected in a row and column matrix, with one terminal of each photosensor connected to a row conductor and another terminal connected to a column conductor. The selector means comprises a microcomputer to sequentially select and energize each of the row conductors with a predetermined voltage. The non-selected rows are connected to the microcomputer and are maintained at circuit ground potential. The column conductors are connected to one terminal of an operational amplifier configured as a comparator. The other terminal of the operational amplifier is connected to a source of predetermined electrical reference voltage. Since all of the non-selected row conductors are held at circuit ground potential, there is no undesirable cross-coupling between the columns.

In this configuration, each column is the equivalent of a voltage divider network, with the sensor connected to the selected row comprising the upper leg of the voltage divider and each of the sensors connected to non-selected rows forming a parallel circuit which comprises the lower leg of the voltage divider circuit. The junction terminal of the upper and lower leg of the voltage divider is connected to the input terminal of the operational amplifier/comparator. The other terminal of the upper leg is connected to the source of predetermined voltage by the microcomputer, while the other terminal of the lower leg is connected to circuit ground.

Since the photoresistance characteristics of all sensors in the array occur in a bell-shaped distribution, the lower leg of the voltage divider, which includes a larger number of sensors than does the upper leg, forms an electrical component, the characteristics of which are well predictable by the bell-shaped statistical distribution. The selected photoresistor is thus being "referenced" to the parallel combination of the remaining column elements, in which the reference is an average of the characteristics of the remaining photoresistors in the column. This yields a much more stable and predictable reference than any one photoresistor alone, as was the case in the prior art.

The averaging characteristics of the present invention are even more applicable in an encoding register which utilizes a "two-or-three-out-of-five" code. The characteristics of the lower leg of the voltage divider which comprises the non-selected photoresistors are thus even more precisely predictable.

DESCRIPTION OF THE PREFERRED EMBODIMENT

Figure 1:
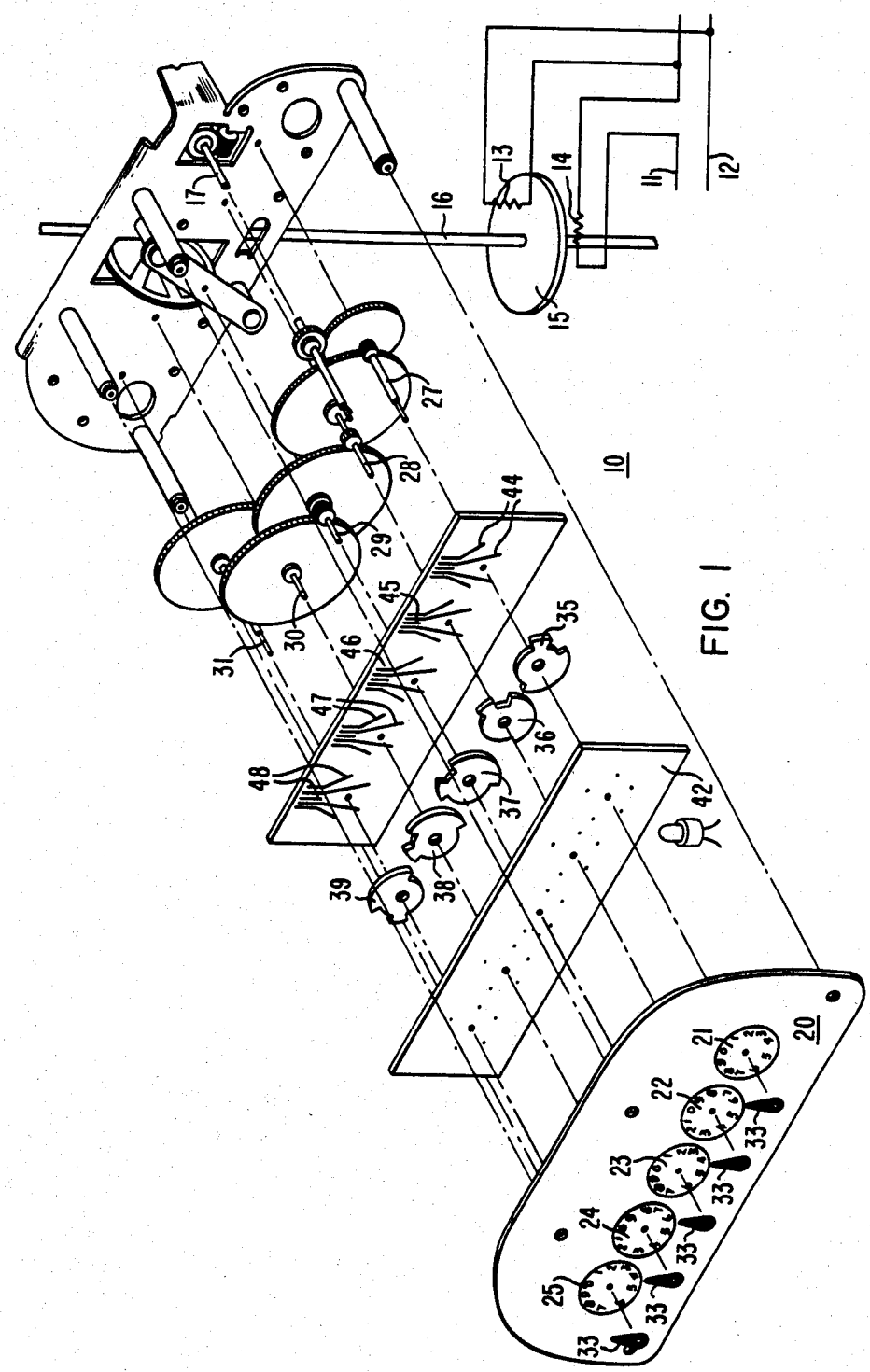
FIG. 1 is an exploded isometric view of a meter encoding register incorporating the principles of the present invention.

Referring now to the drawings in which like reference characters denote the same components, FIG. 1 shows an exploded isometric view of a meter encoding register incorporated into a watthour meter 10 of the type installed at the locations of electric utility customers. The meter 10 measures the quantity of electrical energy flowing through the conductors 11 and 12 by connecting the meter voltage and current coils 13 and 14 thereto. A meter disc 15 and associated shaft 16 are electromagnetically driven by the coil magnetic fluxes in a well-known manner. The shaft 16 drives a gear train (not shown), the output 17 of which drives a gear attached to a first shaft 27 of a five-dial register 20. The shaft 27 drives other shafts 28, 29, 30, and 31 in a decade relationship in a well-known manner. The shafts 27–31 drive corresponding pointers 33 on dials 21–25 to provide a visual indication of the quantity of electrical energy drawn through the conductors 11 and 12. In order to provide an electrical signal representative of the reading of the dials 21–25, the encoder 20 comprises a plurality of notched code wheels 35–39. These wheels are fixedly attached to the shafts 27–31 and rotate therewith.

A source of illumination 40 is provided through a light plate 42 to provide separate illumination beams for each of a plurality of photoresistors 44–48 arranged in groups of five, with one group associated with each of the dials 21–25. The illumination beams are either transmitted to or screened from the photoresistors 44–48 by the rotation of the code wheels 35–39. A more complete description of the operation of this encoder may be obtained in U.S. Pat. No. 4,037,219. An improved version of the encoder is described in U.S. Pat. No. 4,342,908 by T. Henningsen et al. which issued on Aug. 3, 1982.

Figure 2:
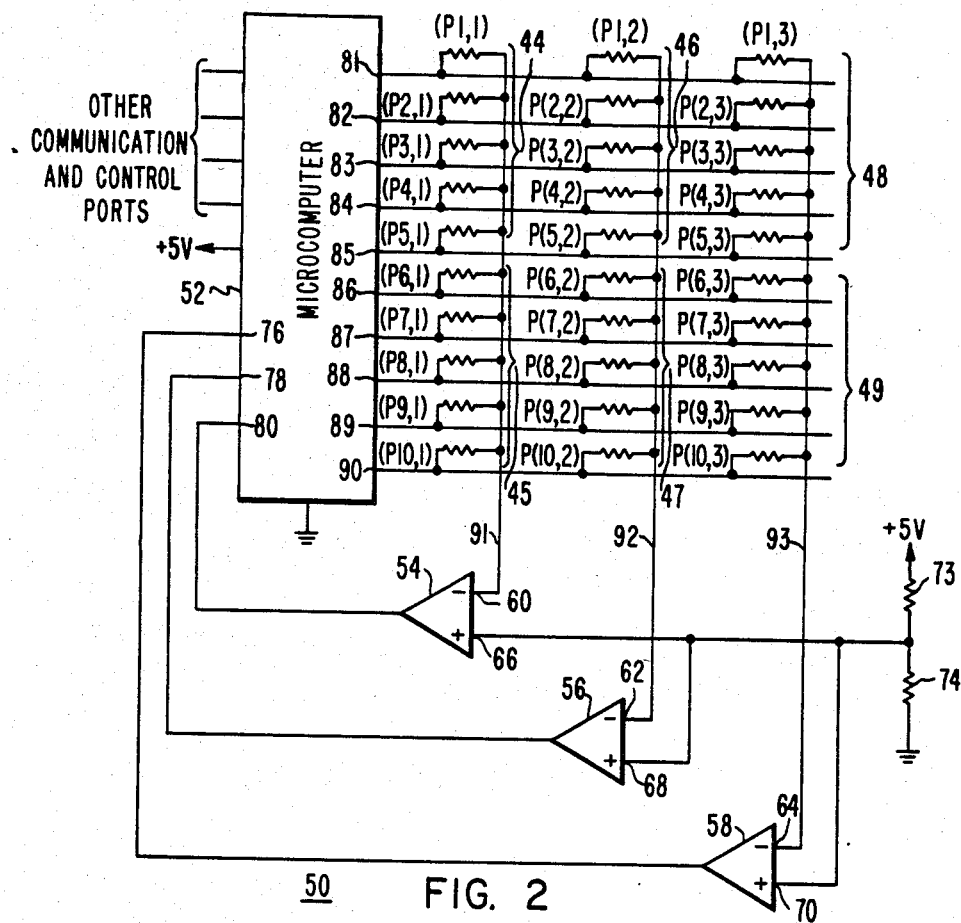
FIG. 2 is a circuit diagram of the encoder of FIG. 1.

The photoresistors are connected in a row and column matrix to electronic circuitry as shown in FIG. 2. The electronic circuitry is contained on a printed circuitboard, not shown in FIG. 1, which may be located in any convenient location in the meter encoding register. As can be seen in FIG. 2, the electronic circuitry 50 comprises a microcomputer 52 which may be, for example, a type COP 320 obtainable in commercial quantities from the National Semiconductor Corporation. The electronic circuitry 50 also includes 3 operational amplifiers 54, 56 and 58 configured as comparators. In this configuration, the operational amplifiers 54, 56 and 58 include inverting inputs 60, 62 and 64, respectively, and non-inverting inputs 66, 68 and 70 each connected to a source of reference voltage formed by resistors 73 and 74 connected between a 5 volt source and ground. The output of the amplifiers 54, 56, and 58 are connected to input terminals of the microcomputer 52 at 76, 78 and 80, respectively.

Figure 5:
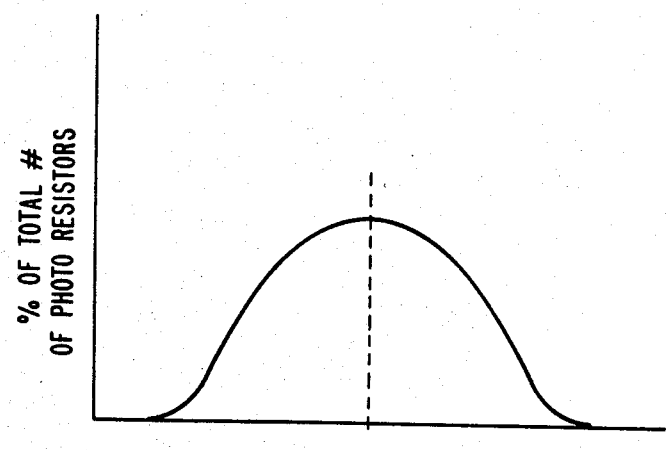
FIG. 5 is a curve representing the statistical distribution of photoresistor resistance.

The photoresistors 44-48 are formed by a spray pyrolysis process which produces a coating of photoresistive material on an insulated metal substrate. In the disclosed embodiment, the photoresistors are formed of cadmium sulfide and exhibit a resistance which varies from a high resistance condition to a low resistance condition in the absence and presence, respectively, of illumination. Due to chemical and process variations the actual values of resistance on any specific photoresistor can fall within a range of values for each state. These ranges approximate a bell-shaped statistical distribution (FIG. 5) about an expected value R of approximately 10 megohms for the high resistance state and 100 kilohms for the low resistance state. However, it is statistically possible for the high-resistance value of one photoresistor to overlap the low resistance value of another.

As can be seen in FIG. 2, the photoresistors are connected in a row and column matrix and include the five groups 44-48 of five photoresistors shown in FIG. 1, plus an additional group 49 of five photoresistors utilized to implement optional features of a meter encoding register. The matrix of photosensors 44-49 includes 10 row conductors 81-90 and 3 column conductors 91, 92 and 93. Each of the photorsistors in groups 44-49 is connected between one of the row conductors and one of the column conductors. Two groups of five photoresistors are thus connected to each column conductor.

The specific photoresistors can be identified by their position in the matrix. For example, the photoresistor in the upper left-hand position of the matrix in FIG. 2 is connected to the first row 81 (beginning at the top) and the first column 91 (beginning at the left). It is thus designated as P(1,1). The photoresistor connected to the upper row 81 and the middle column 92 is designated P(1,2). In a similar manner, each of the photoresistors is designated by terminology of the form P(X,Y) where X=the row number reading from top to bottom and Y=the column number reading from left to right.

In operation, the microcomputer 52 sequentially selects and energizes each of the row conductors with a predetermined electrical potential of, for example, 5 volts. The other nine non-selected row conductors are maintained by the microcomputer 52 at a second predetermined potential, for example, circuit ground potential. Since each photoresistor connected to a selected row is impressed with the same voltage, and each of the non-selected rows is maintained at circuit ground potential, the column conductors are effectively isolated from each other and no undesirable cross-coupling results.

Figure 3:
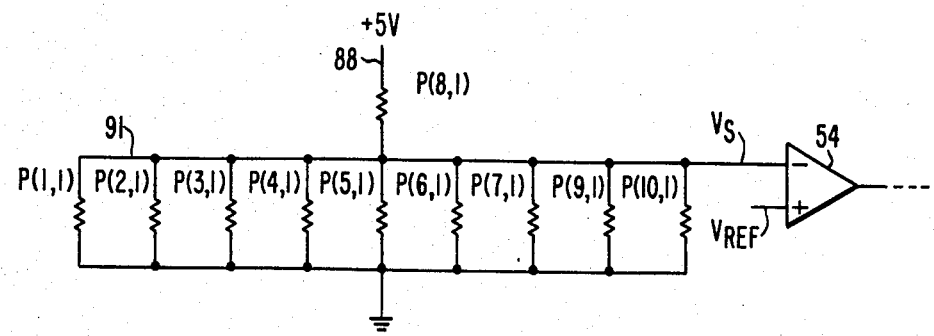
FIG. 3 is an equivalent electrical circuit of the circuit of FIG. 2.

Since each of the column conductors is isolated, that is, the voltage across a row resistor in one column has no effect on the voltage across a row resistor on any other column, the operation of the invention can be understood by examining each column separately. FIG. 3 shows the equivalent circuit for column conductor 91 of the array of FIG. 2, with row conductor 88 being scanned; that is, the microcomputer 52 impresses 5 volts upon conductor 88 while maintaining row conductors 81-87, 89 and 90 at circuit ground potential. From this equivalent circuit, it can be seen that a sense signal $V_s$ appearing at the inverting input of comparator 54 is the result of a voltage divider formed by the scanned photoresistor P(8,1) in series with the parallel combination of the remainder of the column elements. A test signal produced by the voltage drop across the scanned photoresistor combines with a first reference signal produced by the voltage drop across the unscanned photoresistors to form the sense signal voltage $V_s$.

It is to be remembered that the objective of the encoder is to determine the presence or absence of a sensed condition at each of the scanned sensor elements of the array. As shown in FIG. 3, it is desired to determine the presence or absence of light on photoresistor P(8,1) by determining its resistance state. In other words, is the scanned photoresistor P(8,1) in an illuminated or a non-illuminated condition? As has been previously discussed, the resistance of the photoresistor P(8,1) varies between a high resistance state in the absence of illumination and a low resistance state in the presence of illumination. Similarly, each of the remaining resistors of the column, that is, P(1,1), P(2,1), P(3,1), P(4,1), P(5,1), P(6,1), P(7,1), P(9,1) and P(10,1), are either in a high resistance state or a low resistance state depending on whether they are in a non-illuminated or illuminated condition, respectively. The state of each photoresistor is determined by comparing its resistance (or the voltage developed across such resistance) to a reference value. This determination is relatively easy for precision photoresistors having highly uniform electrical characteristics. The cost of such photoresistors is high, however, and it is desirable to use inexpensive photoresistors having wider variations in characteristics. In the prior art, using fixed references, the practical limit of variation of the ratio of actual illuminated resistance of the photoresistor to the average value of such resistance was approximately 30 to 1. Since the photoresistors, as manufactured, exhibited a wider range of variation about the average value, it was necessary to select only those arrays which fell within the prescribed limits.

Although the principles of the present invention are applicable to sensor arrays having no constraints on the simultaneous condition of the elements of the array, the advantages of the invention are particularly evident in an encoder wherein such constraints are present. Such an encoder is described, for example, in the aforementioned U.S. Pat. No. 4,037,219, wherein the 5 photoresistors associated with each dial of the encoder produce an output pattern according to a "two-or-three-out-of-five" code. That is, the configuration of the code wheels is such that at any given time, no less than two out of five nor no more than three out of the five photoresistors in any one group will be illuminated. It is therefore not possible for only a single one of the five photoresistors of any dial to be illuminated, nor is it possible for all of the five photoresistors of any dial to be simultaneously illuminated.

Figure 4:
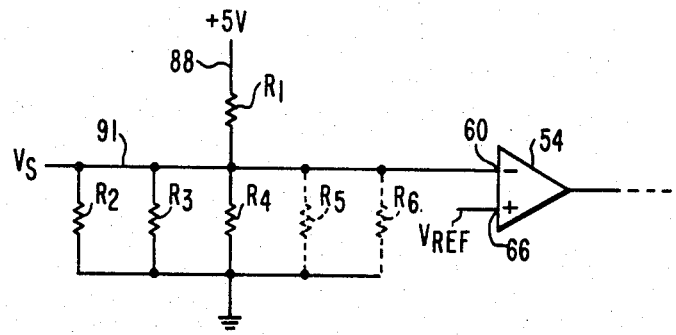
FIG. 4 is an equivalent circuit of a meter encoding register similar to that of FIGS. 1 through 3 which utilizes a "two-or-three-out-of-five" code.

When the photoresistors of two dials of an encoder utilizing a two-or-three-out-of-five code are connected to a common column conductor in a matrix as shown in FIG. 2, the resultant equivalent circuit is as shown in FIG. 4. The two-or-three-out-of-five constraint of course translates to a four-five-or-six-out-of-ten requirement for the two groups of five photoresistors. The resistance of the scanned photoresistor, that is, the photoresistor comprising the upper leg of the voltage divider is designated R1 in the equivalent circuit of FIG. 4. If this potoresistor is in a non-illuminated condition, its corresponding electrical state will be the high resistance state. Since the two-or-three-out-of-five code then demands that of the remaining nine photoresistors in the column at least four be illuminated or in the low resistance state, the resistance of the upper leg of the voltage divider will be much higher than the bottom leg. Most of the voltage drop from the five volt source to ground will therefore occur across the high resistance of the scanned photocell represented by R1, and the value of voltage $V_s$ supplied to the inverting input of the comparator 54 will be very low, quite close to circuit ground potential. Such a condition presents no problem in the proper detection of the resistive state of R1 by the comparator 54. The output of the array is clear and unequivocal.

A more difficult problem is presented if the scanned photoresistor symbolized by R1 is in the illuminated or low resistance state. Under these conditions, the two-or-three-out-of-five code states that for the nine remaining resistors of the column at least three will be illuminated, that is in a low resistance state. Thus, three resistors are shown in solid lines in the lower leg of the voltage divider of FIG. 4. The two-or-three-out-of-five code further specifies that if R1 is illuminated, no more than five additional photoresistors of the column will be illuminated or in the low resistance state. The others are constrained by the code to be in the high resistance state. Since the expected value of the high resistance state is several orders of magnitude greater than the expected value of the low resistance state, such parallel-connected high resistance state photoresistors can be effectively ignored in the equivalent circuit of FIG. 4. Correspondingly, in addition to the three resistors shown in solid lines in FIG. 4, only two additional resistors representing the possibility of no more than two additional illuminated photoresistors are shown in dashed lines.

If the scanned photoresistor is in an illuminated low resistance condition then the resistance R1 will comprise a much lower proportion of the total voltage drop across the divider. Since the resistance of R1 is three to five times greater than the resistance of the three to five identical parallel connected resistance of the lower leg of the voltage divider (assuming median values of resistance for all photoresistors), then the sensed voltage will be approximately 0.83–1.25 volts. This is considerably higher than the value of $V_s$ if the photoresistor represented by R1 is in a non-illuminated high resistance condition.

The problem, of course, is that it is unlikely that any photoresistor will have a resistance exactly equal to the median value of the corresponding state. If the resistance of the scanned photoresistor is judged against only a fixed reference value, then this reference value or threshold must take into account the bell-shaped distribution of values for each of the two electrical states shown in FIG. 5 which the scanned photoresistor can assume. In order to produce a reliable encoder, it is necessary when using a fixed reference to more closely restrict the allowed values of these two states. That is, it is necessary to specify tighter tolerances for the photoresistors as manufactured to obtain a sharper peak in the distribution curve. This of course increases cost.

The use of a single continuously illuminated photosistor deposited on a common array with the scanned photoresistor to provide a reference value allows a looser tolerance to be specified for the photoresistors. However, it is still possible for the reference photoresistor and the scanned photoresistor to assume any value within the distribution curve. By using the principles of the present invention as described in this embodiment, a plurality of unscanned photoresistors are effectively employed as a reference. It is extremely unlikely that the unscanned photoresistors in the bottom leg of the voltage divider of FIG. 3 will all assume extreme values at the same end of the bell-shaped distribution curve. The laws of probability dictate that the parallel resistance of the three to five unscanned photoresistors which make up the bottom leg of the voltage divider will be more proportional to the median resistance of all photoresistors than will any single photoresistor. Using this characteristic, a threshold value of $V_s$ and a voltage reference $V_{ref}$ can be chosen such that the characteristics of photoresistors utilized in the encoder can be specified to a looser tolerance and yet permit the encoder to achieve a higher degree of accuracy in reproducing the desired quantity. It is even possible to obtain proper operation of the encoder where the low-resistance and high-resistance values of photoresistors overlap.

In selecting the operating characteristics of an encoder, it is necessary that the encoder provide an accurate indication of the true electrical state of the sensor element being scanned. That is, if the scanned photoresistor is indeed illuminated, the encoder must provide an output signal which so indicates, and avoid producing a signal indicating that the photoresistor is not illuminated. The reverse is also true in that the encoder must not indicate that the scanned photoresistor is being illuminated when it actually is not. In furtherance of this objective, a threshold reference voltage must be chosen such that the encoder will produce an output signal indicating an illuminated photoresistor whenever the sensed voltage $V_s$ is above this threshold level. To provide the most positive and accurate such indication for photoresistors exhibiting a wide range of illuminated resistances, it is of course desirable that the threshold be set as low as possible in comparison with the average value of $V_s$ produced by an illuminated scanned photoresistor. A conflicting consideration is that at very low levels of input voltage to the comparators 54–58, noise impulses can produce false indications.

The steps for choosing the operating conditions of the encoder described in the present embodiment are as follows. First a threshold value of the sense voltage $V_s$ is chosen. This is the lowest voltage which the comparators 54, 56, 68 can reliably distinguish above the noise pulses expected in the environment of the desired application. For purposes of illustration, the threshold value may be chosen as 0.010 volts. Once this threshold voltage is chosen, the upper limit of the allowable low-resistance (illuminated) state of any scanned resistor can be determined.

From FIG. 4 it can be seen that the sensed voltage $V_s$ is shown by Equation I:

$$V_S = \frac{V_{cc} \times \dfrac{1}{1/R_2 + 1/R_3 + 1/R_4 + 1/R_5 + 1/R_6}}{R_1 + \dfrac{1}{1/R_2 + 1/R_3 + 1/R_4 + 1/R_5 + 1/R_6}} \simeq \frac{5 \times R/5}{NR + R/5} = \frac{1}{N + .2} \quad (I)$$

where $V_{cc} = 5$ volts

R = the median value of illuminated photoresistor resistance and

N = the maximum multiple of R which will still yield a "lighted" signal.

By substituting the selected threshold value for $V_s$, the critical value NR of the scanned resistor can be determined, that is, the maximum value of resistance the scanned photoresistor can assume which the encoder will still interpret as a low resistance illuminated photoresistor.

Under laboratory conditions, the comparators 54–58 can successfully detect a voltage $V_s$ as low as 10 millivolts before noise pulses obscure the signal. As has been discussed above, if the scanned photoresistor is in the off condition, the voltage $V_s$ will be substantially lower than this. Thus, the choice of the threshold value of $V_s$, that is, the value chosen to indicate that a higher sensed voltage represents an on condition and a lower sensed voltage represents an off condition, is limited solely by noise considerations. With a supply voltage $V_{cc}$ equal to 5 volts and choosing the minimum detectable threshold voltage of 10 millivolts, Equation I can be solved to yield a value of N equal to approximately 100. In other words, the present invention provides an encoder which will accurately discriminate between an illuminated and non-illuminated photoresistor using photoresistors having an illuminated resistance of as much as 100 times the average value of illuminated resistance. The above result is obtainable under laboratory conditions. For a practical encoder for use in the field, noise impulses may easily reach the 10 millivolt level. Therefore, the threshold voltage of $V_s$ is set to a somewhat higher value. Again, the threshold value is not limited by uncertainty in the reference but in the desire to provide greater noise immunity.

Since some types of microcomputers may not be able to supply a 5 volt signal of sufficient stability, buffer amplifiers may be inserted between the output terminals of the microcomputer 52 and the row conductors of the matrix. Buffer amplifiers such as a type CD4050 hex buffer manufactured by the National Semiconductor Corporation can provide a stable 5 volt input signal to the row conductors when activated by the output terminals of the microcomputer.

In summary, the present invention provides an encoder utilizing a plurality of sensors in a matrix configuration which discerns the state of selected sensors by comparison to a reference comprising several unselected sensors. Although the described embodiment employs photoresistive sensors, the invention is not so limited, and may be applied to matrix encoders using other types of sensors.

Increased ratio detection allows the use of photoresistors having an on resistance of as much as 100 times the average value of ON resistance, as compared to prior art encoders whose performance was limited to a ratio of approximately 30 to 1. Separate reference compensation circuits are not required in the present invention as was sometimes the case in the prior art. Since the photoresistors of the reference have the same characteristics as the scanned photoresistor and are illuminated by the same illumination source, they provide automatic compensation without the need for other circuits. Furthermore, by tying the unscanned photoresistors to circuit ground potential, the impedance level of the design is lowered resulting in increased noise immunity.

I claim:

1. Encoder apparatus comprising:
   means for selectively supplying a sensed condition in response to an input condition,
   a set of resistive sensors coupled to said supply means and operable between a first resistive state in the absence of said sensed condition and a second resistive state in the presence of said sensed condition,
   means for sequentially selecting a subset of said sensor set and for generating a test signal responsive to said sensed condition,
   reference means for deriving a first reference signal from the non-selected sensors of said set,
   means for providing a second reference signal, said second reference signal having a preselected known magnitude,
   comparator means connected to said selected subset and to the non-selected sensors of said set for processing said test signal and also connected to said second reference signal and for generating an output signal representative of the resistive state of said selected sensors from the relative values of said test signal and said first reference signal, said comparator means being connected to said reference means.

2. An encoder as recited in claim 1 wherein said selecting means selects one of said sensors as said subset.

3. An encoder as recited in claim 2 wherein each of said sensors comprises a two terminal variable resistor, said selecting means being configured to cause one terminal of each of said non-selected sensors to be connected to a first predetermined potential and one terminal of said selected sensor to be connected to a second predetermined potential,
   said encoder comprising sense output terminal means connected to the second terminals of each of said non-selected sensors and the second terminal of said selected sensor for combining said test signal and said first reference signal to form a sense signal, and
   said comparator means comprises two input terminals and an output terminal, one of said input terminals being connected to said sense signal and the other of said input terminals being connected to said second reference signal, said comparator means being configured to generate said output signal when said sense signal exceeds said second reference signal.

4. An encoder as recited in claim 3 wherein said first predetermined potential is circuit ground potential.

5. An encoder as recited in claim 3 wherein said means for supplying said sensed condition comprises means for insuring that the number of said sensors subjected to said sensed condition at any time is within predetermined limits.

6. An encoder as recited in claim 5 wherein the number of said sensors subjected to said sensed condition is greater than one.

7. An encoder for sensor arrays, comprising:
   a set of sensors operable between a first electrical state in the absence of a sensed condition and a second electrical state in the presence of said sensed condition, said first and second states each defined by upper and lower values of electrical parameters,
   means for selectively subjecting a first plurality of sensors of said set of sensors to said sensed condition, means for sequentially selecting a subset of said sensor set, comparator means connected to said selected subset and non-selected sensors for comparing said selected subset to said non-selected sensors of said sensor set to determine the electrical state of said selected subset and for generating an output signal representative of the electrical state of said selected subset.

8. An encoder as recited in claim 7 wherein said first and second electrical states have overlapping parameter values.

* * * * *